US011437519B2

(12) United States Patent
Zhang

(10) Patent No.: US 11,437,519 B2
(45) Date of Patent: Sep. 6, 2022

(54) TFT DEVICE AND MANUFACTURING METHOD OF SAME, TFT ARRAY SUBSTRATE, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Wenbo Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 278 days.

(21) Appl. No.: 16/615,288

(22) PCT Filed: Oct. 25, 2019

(86) PCT No.: PCT/CN2019/113379
§ 371 (c)(1),
(2) Date: Nov. 20, 2019

(87) PCT Pub. No.: WO2021/035923
PCT Pub. Date: Mar. 4, 2021

(65) Prior Publication Data
US 2021/0359137 A1 Nov. 18, 2021

(30) Foreign Application Priority Data
Aug. 28, 2019 (CN) .......................... 201910801156.2

(51) Int. Cl.
H01L 29/786 (2006.01)
H01L 27/32 (2006.01)
H01L 29/66 (2006.01)

(52) U.S. Cl.
CPC .. *H01L 29/78618* (2013.01); *H01L 29/66969* (2013.01); *H01L 29/78633* (2013.01); *H01L 29/78696* (2013.01); *H01L 29/7869* (2013.01)

(58) Field of Classification Search
CPC ............. H01L 27/1248; H01L 27/3276; H01L 29/66969; H01L 27/3272; H01L 27/1288
See application file for complete search history.

(56) References Cited

U.S. PATENT DOCUMENTS

2013/0161622 A1* 6/2013 Lee ...................... H01L 21/0274
257/57
2016/0071891 A1* 3/2016 Oh ...................... H01L 27/1262
257/72

(Continued)

FOREIGN PATENT DOCUMENTS

CN 101692439 A 4/2010
CN 202473925 U 10/2012

(Continued)

OTHER PUBLICATIONS

Machine translation of WO 2020/186450 A1 (Year: 2020).*

*Primary Examiner* — Brian Turner
(74) *Attorney, Agent, or Firm* — Osha Bergman Watanabe & Burton LLP

(57) ABSTRACT

A TFT device and a manufacturing method of the same, a TFT array substrate and a display device is provided by this disclosure. A light-shielding layer is configured under the active layer, and one of the source doping member and the drain doping member is attached to the buffer layer and the light-shielding layer to generate a stable voltage on the light-shielding layer. At the same time, forming holes in the light-shielding layer and the buffer layer is avoided and connecting a source electrode, the active layer and the light-shielding layer with conductive lines is no more needed, which decreases one mask, and corresponding expo- (Continued)

sure and etching process, thus decreases manufacturing cost of the TFT.

11 Claims, 7 Drawing Sheets

(56) References Cited

U.S. PATENT DOCUMENTS

| | | | |
|---|---|---|---|
| 2017/0090229 A1 | 3/2017 | Imai et al. | |
| 2017/0345882 A1* | 11/2017 | Nam | H01L 27/3258 |
| 2018/0323347 A1 | 11/2018 | Liu | |
| 2018/0337245 A1* | 11/2018 | Lu | H01L 29/4908 |
| 2020/0089064 A1* | 3/2020 | Morinaga | G02F 1/136209 |
| 2020/0168687 A1* | 5/2020 | Hu | H01L 27/3272 |
| 2020/0243566 A1 | 7/2020 | Liu | |
| 2021/0074735 A1* | 3/2021 | Zhou | H01L 29/42384 |

FOREIGN PATENT DOCUMENTS

| | | |
|---|---|---|
| CN | 107424935 A | 12/2017 |
| CN | 108470717 A | 8/2018 |
| CN | 108550553 A | 9/2018 |
| WO | WO-2020186450 A1 * | 9/2020 |

* cited by examiner providing a base substrate, forming a light-shielding layer on the base substrate, forming a buffer layer which covers the light-shielding layer on the light-shielding layer,
forming an active layer on the buffer layer corresponding to the light-shielding layer, wherein the active layer comprises a channel, and a source doping member and a drain doping member which are disposed on two sides of the channel ~S10 attaching one of the source doping member and the drain doping member to the buffer layer and the light-shielding layer. ~S20

FIG. 3

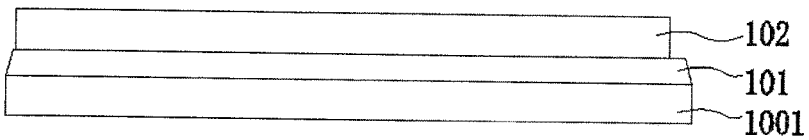

FIG. 4a

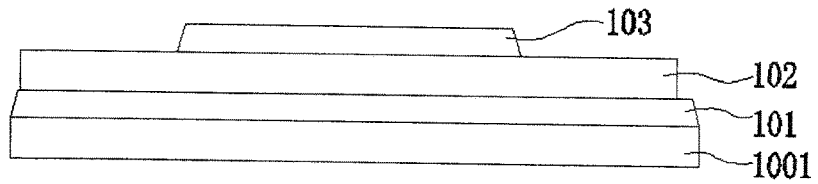

FIG. 4b

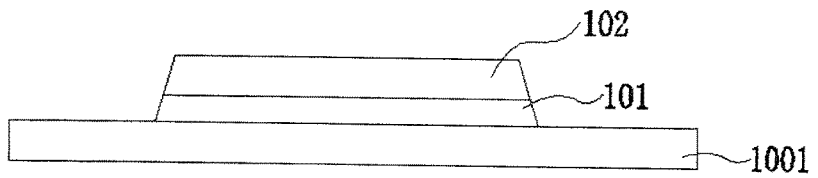

FIG. 4c

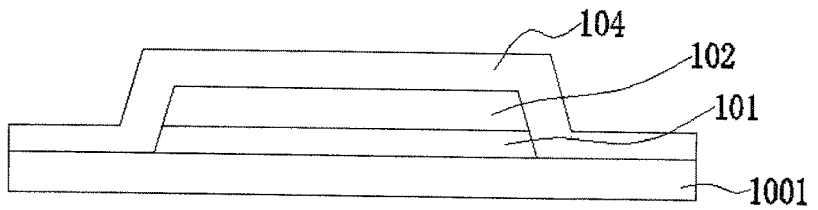

FIG. 4d

TFT DEVICE AND MANUFACTURING METHOD OF SAME, TFT ARRAY SUBSTRATE, AND DISPLAY DEVICE

BACKGROUND OF INVENTION

Field of Invention

This disclosure relates to the field of display technology, particularly, relates to TFT device and manufacturing method of same, TFT array substrate, and display device.

Description of Prior Art

Thin film transistors (TFTs) are important components of a tablet display device. They can be formed on a glass substrate or a plastic substrate. Generally, they are used in liquid crystal display (LCD) devices and organic light emitting (OLED) devices as a switching device and a driving device.

As a metal oxide semiconductor is quite sensitive to illumination, when the metal oxide semiconductor is illuminated by light, obviously, a threshold voltage of a metal oxide semiconductor TFT shifts negatively. Presently, an improved method configures a metal light-shielding layer under an active layer consisted of the metal oxide semiconductor material to eliminate the negative shift of the threshold voltage of the TFT induced by illumination. But the metal light-shielding layer can be easily affected by voltages of other charged structural layers so as to carry various uncertain voltages, which can easily lead to a floating gate effect. The threshold voltage of the TFT will be changing continuously during working, which leads to an unstable operation of the TFT. Presently, an improved method is to form holes in the light-shielding layer and a buffer layer and connecting a source electrode, the active layer and the light-shielding layer with conductive lines to shield the voltage of the light-shielding layer.

Above all, the TFT device in prior art can easily induce a floating gate effect so as to affect operational stability of the TFT. It is needed to form holes in the light-shielding layer and the buffer layer and connect the source electrode, the active layer and the light-shielding layer with conductive lines, which adds one more mask, and corresponding exposure and etching process. Problem of manufacturing cost-up of the TFT needs to be solved.

SUMMARY OF INVENTION

This disclosure provides a TFT device and manufacturing method of the same, TFT array substrate, and display device to solve following problems: a floating gate effect can easily happen in the TFT device in prior art so as to affect the operational stability of the TFT. It is needed to form holes in the light-shielding layer and the buffer layer and connect the source electrode, the active layer and the light-shielding layer with conductive lines, which adds one more mask, and corresponding exposure and etching process, thus increase manufacturing cost of the TFT.

To solve the above problems, a TFT thin film transistor (TFT) device is provided, comprising:
a base substrate;
a light-shielding layer disposed on the base substrate;
a buffer layer disposed on the light-shielding layer and covering the light-shielding layer;
an active layer disposed on the buffer layer and corresponding to the light-shielding layer, wherein the active layer comprises a channel, and a source doping member and a drain doping member which are disposed on two sides of the channel;
wherein one of the source doping member and the drain doping member is attached to the buffer layer and the light-shielding layer.

In one exemplary embodiment, a cross-sectional shape of the active layer comprises a bending shape and comprises a horizontal part and an inclined part, and the horizontal part is connected to the light-shielding layer through the inclined part.

In one exemplary embodiment, the horizontal part and the inclined part are integrally formed, and the inclined part is attached to the buffer layer and the light-shielding layer, and the inclined part extends to a surface of the base substrate.

In one exemplary embodiment, the materials of the active layer is metal oxide, and the source doping member and the drain doping member are defined as conductive layers after a conductive treatment.

In one exemplary embodiment, a source electrode of the TFT device is electrically connected to the light-shielding layer by the source doping member, and a drain electrode of the TFT device is insulated from the light-shielding layer.

In one exemplary embodiment, a drain electrode of the TFT device is electrically connected to the light-shielding layer by the drain doping member, and a source electrode of the TFT device is insulated from the light-shielding layer.

To solve the above problems, a manufacturing method of a TFT device is also provided, comprising following steps:
a step of S10 of providing a base substrate, forming a light-shielding layer on the base substrate, forming a buffer layer which covers the light-shielding layer on the light-shielding layer, and forming an active layer on the buffer layer corresponding to the light-shielding layer, wherein the active layer comprises a channel, and a source doping member and a drain doping member which are disposed on two sides of the channel; and
a step of S20 of attaching one of the source doping member and the drain doping member to the buffer layer and the light-shielding layer.

In one exemplary embodiment, the step of S20 of attaching one of the source doping member and the drain doping member to the buffer layer and the light-shielding layer further comprises the steps:
selecting metal oxide semiconductor material as materials of the source doping member and the drain doping member, and processing conductive treatment on the metal oxide semiconductor to decrease the oxygen content, so that a resistivity of the metal oxide semiconductor material decreases and the metal oxide semiconductor material turns into conductor.

According to the above TFT device, a TFT array substrate is provided, comprising the above-mentioned TFT device.

According to the purpose of this disclosure, a display device is provided, comprising the above-mentioned TFT array substrate.

Beneficial effects of disclosure would be as below: by configuring the light-shielding layer under the active layer, the active layer can be protected from illumination, the negative shift of the threshold voltage of the TFT can be prevented. One end of the active layer is attached to the buffer layer and the light-shielding layer and extends to the surface of the base substrate. A conductive treatment is conducted on the active layer with a gate electrode and a gate insulator as stopper layers, one of the source doping member and the drain doping member is attached to the buffer layer and the light-shielding layer to generate a stable voltage on the light-shielding layer to prevent the floating gate effect from happening and increase the operational stability of the TFT. At the same time, forming holes in the light-shielding layer and the buffer layer is avoided and connecting the source electrode, the active layer and the light-shielding layer with conductive lines is no more needed, which decreases one mask, and corresponding exposure and etching process, thus decreases manufacturing cost of the TFT.

BRIEF DESCRIPTION OF DRAWINGS

To make the technical solution of the embodiments according to the present invention clear, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

FIG. 3 is a flowchart of a manufacturing method of the TFT device according to an embodiment of present disclosure.

FIG. 4a is a flowchart of preparing a light-shielding layer and a buffer layer of the TFT device according to an embodiment of present disclosure.

FIG. 4b is a flowchart of preparing a first photo-resist layer of the TFT device according to an embodiment of present disclosure.

FIG. 4c is a flowchart of etching the light-shielding layer and the buffer layer of the TFT device according to an embodiment of present disclosure.

FIG. 4d is a flowchart of depositing the active layer of the TFT device according to an embodiment of present disclosure.

DETAILED DESCRIPTION OF PREFERRED EMBODIMENTS

The disclosure is further described in detail below with reference to the accompanying drawings and embodiments. It is noted that the embodiments described herein is only used to describe this disclosure, and the scope of the disclosure is not limited to the embodiments described herein. Similarly, the following embodiments are only part of the disclosure but not all. For those having ordinary skills in the art, other embodiments may be easily obtained from these embodiments without paying any creative effort, which belongs to the scope of the disclosure.

This disclosure aims to solve following problems: a floating gate effect can easily happen in thin film transistor (TFT) devices in the prior art so as to affect the operational stability of TFT. It is needed to form holes in the light-shielding layer and the buffer layer and connect a source electrode, the active layer and the light-shielding layer with conductive lines, which adds one more mask, and corresponding exposure and etching process, thus increase manufacturing cost of the TFT. This embodiment can solve the above problem.

Figure 1:
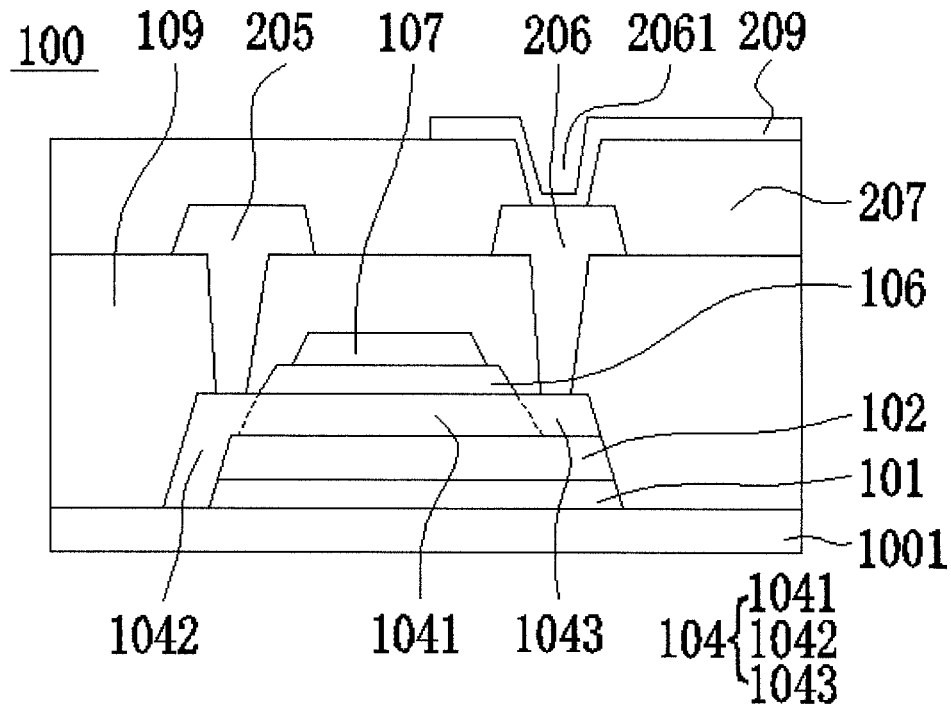
FIG. 1 is a schematic view of a TFT device according to an embodiment of present disclosure.

As shown in FIG. 1, a TFT device 100 provided by this disclosure comprises a base substrate 1001; a light-shielding layer 101 disposed on the base substrate 1001; a buffer layer 102 disposed on the light-shielding layer 101 and covering the light-shielding layer 101; an active layer 104 disposed on the buffer layer 102 and corresponding to the light-shielding layer 101. The active layer 104 comprises a channel 1041 and a source doping member 1042 and a drain doping member 1043 which are disposed on two sides of the channel 1041. One of the source doping member 1042 and the drain doping member 1043 is attached to the buffer layer 102 and the light-shielding layer 101. A cross-sectional shape of the active layer 104 comprises a bending shape and comprises a horizontal part and an inclined part. The horizontal part is connected to the light-shielding layer through the inclined part. The horizontal part and the inclined part are integrally formed. The inclined part is attached to the buffer layer 102 and the light-shielding layer 101 and extends to a surface of the base substrate 1001.

In this embodiment, the doping source member 1042 is attached to the buffer layer 102 and the light-shielding layer 101. A source electrode 205 of the TFT device 100 is electrically connected to the light-shielding layer 101 by the source doping member 1042, a drain electrode 206 of the TFT device 100 is insulated from the light-shielding layer 101. It generates a stable voltage on the light-shielding layer 101 to prevent a floating gate effect of TFT from happening and increase operational stability of the TFT. At the same time, forming holes in the light-shielding layer 101 and the buffer layer 102 is avoided and connecting the source electrode 205, the active layer 104 and the light-shielding layer 101 with conductive lines is not needed, which decreases one mask, and corresponding exposure and etching process, thus decreases manufacturing cost of the TFT.

Specifically, the TFT device 100 provided by this disclosures comprises a light-shielding layer 101 formed on the base substrate 1001, a buffer layer 102 formed on the light-shielding layer 101, an active layer 104 formed on the buffer layer 102, a gate insulating layer 106 formed on the active layer 104, a gate electrode 107 formed on the gate insulating 106, an insulating interlayer 109 formed on the base substrate 1001, a source electrode 205 and a drain electrode 206 formed on the insulating interlayer 109, a passivation layer 207 formed on the insulating interlayer 109 and a pixel electrode layer 209 formed on the passivation layer 207. The pixel electrode layer 209 is connected to the drain electrode 206 through a via 2061 formed in the passivation layer 207. The insulating interlayer 109 covers the light-shielding layer 101, the buffer layer 102, the active layer 104, the gate insulating layer 106 and the gate electrode 107.

A orthographic projection on the base substrate 1001 of the light-shielding layer 101 covers a orthographic projection on the base substrate 1001 of the channel 1041, allowing the light-shielding layer 101 to fully cover the channel 1041, protecting the active layer 104 form illumination, the negative shift of the threshold voltage of the TFT is avoided, which increases the operational stability of the TFT.

The cross-sectional shape of the active layer 104 has a bending shape. The source doping member 1042 and the channel 1042 form a pre-set angle. The source doping member 1042 comprises a horizontal part and an inclined part, the horizontal part and the inclined part are integrally formed and located in the same layer. The inclined part is attached to the buffer layer 102 and the light-shielding layer 101 and extends to a surface of the base substrate 1011. The materials of the active layer 104 is one or more of indium gallium zinc oxide, indium zinc tin oxide and indium gallium zinc tin oxide. The source doping member 1042 and the drain doping member 1043 are defined as conductive layers after a conductive treatment. The thickness of the active layer 104 is in a range of 5 nm to 500 nm. The thickness of the light-shielding layer 101 is in a range of 20 nm to 500 nm. The thickness of the buffer layer 102 is in a range of 50 nm to 100 nm.

Conductive treatment of the active layer 104 is processed using plasma with the gate electrode 107 and the gate insulating layer 106 as etch stopper to split the active layer 104 into the channel 1041 located under the gate insulating layer 106 and the source doping member 1042 and the drain doping member 1043 which are disposed on two sides of the channel 1041. A material of the channel 1041 is metal oxide semiconductor material which remains the characteristics of semiconductor. Materials of the source doping member and the drain doping member are defined as metal oxide semiconductor material after a conductive treatment. The source doping member 1042 is attached to side surfaces of the buffer layer 102 and the light-shielding layer 101 and extends to a surface of the base surface1001. The source doping member 1042 is electrically connected to the light-shielding layer 101.

The insulating interlayer 109 comprises a SiN layer and a SiO layer which are sequentially stacked. Firstly, the SiN layer is deposited and then the SiO layer is deposited. When the deposition of the SiN layer and the SiO layer is completed, activation and hydrogenation treatment by ion implantation is necessary for he SiN layer and the SiO layer for the purpose of repairing dangling bonds of polysilicon. After process of exposure, wet-etching and stripping of photo-resist, preparation of the insulating interlayer 109 is completed, ensuring great flexibility and stability of the insulating interlayer 109. Also, a stress which the insulating interlayer 109 is subjected to is quite small and would not damage the TFT film layers, thus would not cause a crack and stripping of the TFT film layers.

Figure 2:
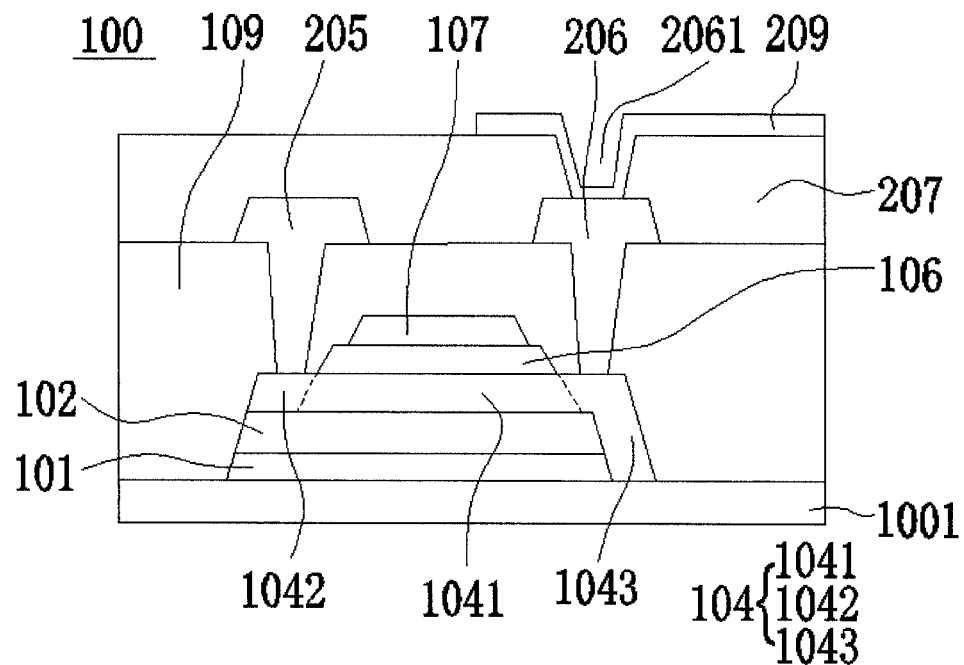
FIG. 2 is a structural schematic view of another structure of an active layer of the TFT device according to an embodiment of present disclosure.

As shown in FIG. 2, another structure of the active layer of the TFT device 100 is provided by present disclosure. In this embodiment, the drain doping member 1043 is attached to the buffer layer 102 and the light-shielding layer 101. A drain electrode 206 of the TFT device 100 is electrically connected to the light-shielding layer 101 by the drain doping member 1043. A source electrode 205 of the TFT device 100 is insulated from the light-shielding layer 101. It generates a stable voltage on the light-shielding layer 101 to prevent a floating gate effect of the TFT from happening and increase operational stability of the TFT. At the same time, forming holes in the light-shielding layer 101 and the buffer layer 102 is avoided and connecting the drain electrode 206, the active layer 104 and the light-shielding layer 101 with conductive lines is not needed, which decreases one mask, and corresponding exposure and etching process, thus decreases manufacturing cost of the TFT.

As shown in FIG. 3, FIG. 3 is a flowchart of a manufacturing method of the TFT device according to an embodiment of present disclosure, the manufacturing method comprises following steps:

A step of S10 of providing a base substrate, forming a light-shielding layer on the base substrate, forming a buffer layer which covers the light-shielding layer on the light-shielding layer, forming an active layer on the buffer layer corresponding to the light-shielding layer, wherein the active layer comprises a channel, and a source doping member and a drain doping member which are disposed on two sides of the channel.

A step of S20 of attaching one of the source doping member and the drain doping member to the buffer layer and the light-shielding layer.

Specifically, as shown in FIG. 4a to FIG. 5i, in this embodiment, the source doping member 1042 is attached to the buffer layer 102 and the light-shielding layer 101.

As shown in FIG. 4a, generally, the base substrate 1001 is a glass substrate, also it can be substrate made of other materials. There is no limitation on the material of the base substrate. After cleaning the base substrate 1001 with cleaning liquid such as pure water or hot sulfuric acid and so on, the light-shielding layer 101 is formed on the base substrate 1001, the buffer layer 102 is formed on the light-shielding layer 101 and The buffer layer 102 covers the light-shielding layer 101. The thickness of the light-shielding layer 101 is in a range of 20 nm to 500 nm. The thickness of the buffer layer 102 is in a range of 50 nm to 100 nm. Material of the light-shielding layer 101 is metal, one or an alloy of more than one of molybdenum (Mo), aluminum (Al), copper (Cu), titanium (Ti) is preferred. The buffer layer 102 is silicon oxide (SiOx) thin films, silicon nitride (SiNx) thin films, or laminated film of silicon oxide thin films and silicon nitride thin films arranged in an alternately-stacked way.

As shown in FIG. 4b, the first photoresistor layer 103 is coated on a surface of the buffer layer 102 by a coating process. The first photoresistor layer 103 is patterned using a mask. The retained first photoresistor layer 103 defines the patterns of the light-shielding layer 101 and the buffer layer 102 on the light-shielding layer 101 and the buffer layer 102

As shown in FIG. 4c, the light-shielding layer 101 and the buffer layer 102 are etched with the first photoresistor layer 103 as etch stopper. The corresponding light-shielding layer 101 and the buffer layer 102 are obtained, and the first photoresist layer 103 is stripped.

Figure 4E:
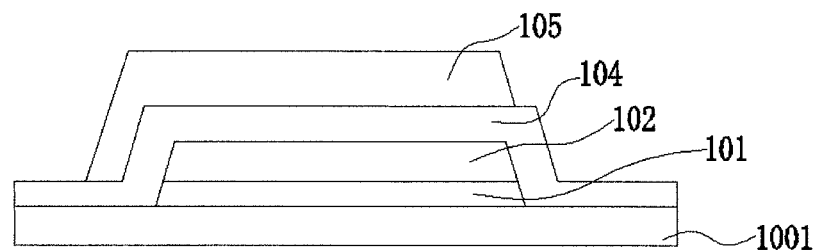
FIG. 4e is a flowchart of preparing a second photo-resist layer of the TFT device according to an embodiment of present disclosure.

As shown in FIG. 4d and FIG. 4e, the active layer 104 corresponding to the light-shielding layer 101 is formed on the buffer layer 102. A second photoresistor layer 105 is coated on a surface of the active layer 104 by a coating process. The second photoresistor 105 is patterned using a mask. The retained second photoresistor layer 105 defines the pattern of the active layer 104 on the active layer 104.

Figure 4F:
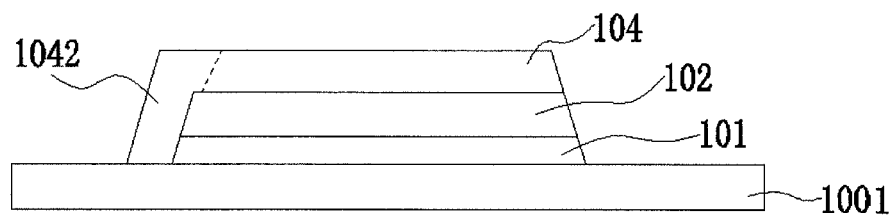
FIG. 4f is a flowchart of etching the active layer of the TFT device according to an embodiment of present disclosure.

As shown in FIG. 4f, the active layer 104 is etched with the second photoresist layer 105 as etch stopper, and the corresponding active layer 104 is obtained and the second photoresist layer 105 is stripped. The source doping member 1042 is attached to the buffer layer 102 and the light-shielding layer 101.

A material of the active layer 104 is one or more than one of indium gallium zinc oxide (IGZO), indium zinc tin oxide (IZTO), and indium gallium zinc tin oxide (IGZTO). The second photoresist layer 105 is patterned by photolithography process. Finally, the active layer 104 is overlapped and connected with the light-shielding layer 101. In this embodiment, a thickness of active layer 104 is in a range from 5 nm to 500 nm. It is deposited on the buffer layer 102 by one of magnetron sputtering, metal organic chemical vapor deposition (MOCVD) and pulsed laser deposition (PLD). An annealing treatment is conducted after a deposition of active layer 104. The annealing treatment can last for about 0.5 hours in dry air at 400° C.

After the annealing treatment, the active layer 104 is etched by wet-etching or dry-etching process. The wet-etching is conducted with oxalic acid as etching solution. After etching process, the whole layer of the metal oxide film of the active layer 104 is patterned to form an island-shaped metal oxide semiconductor layer.

Figure 4G:
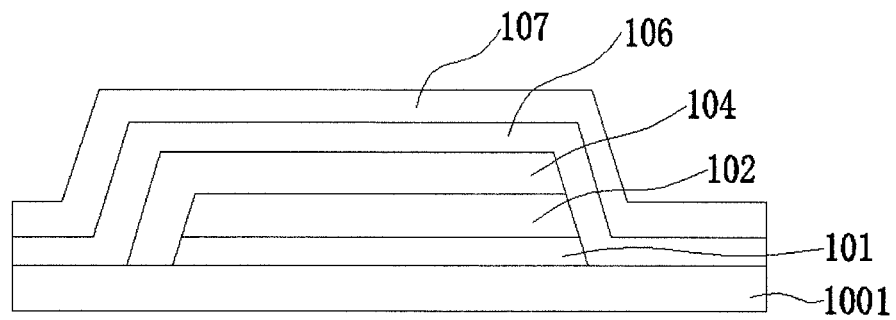
FIG. 4g is a flowchart of depositing a gate insulator layer and a gate electrode of the TFT device according to an embodiment of present disclosure.

As shown in FIG. 4g, a gate insulation layer 106 is formed on the active layer 104 by chemical vapor deposition, and a gate electrode 107 is formed on the gate insulation layer 106 by physical vapor deposition.

Figure 4H:
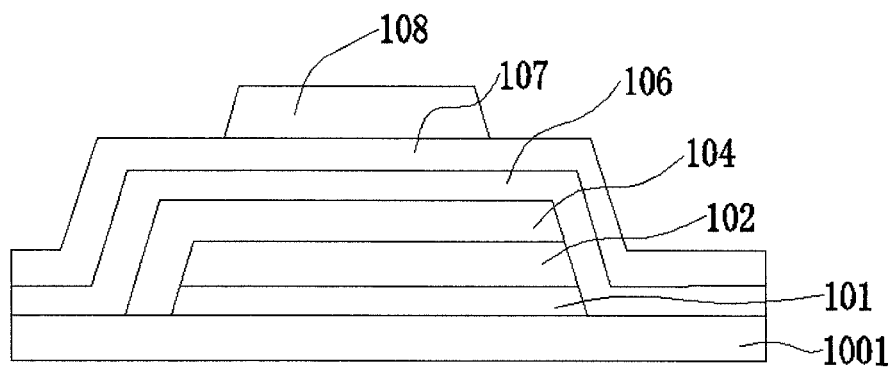
FIG. 4h is a flowchart of preparing a third photo-resist layer of the TFT device according to an embodiment of present disclosure.

As shown in FIG. 4h, a third photoresist layer 108 is coated on a surface of the gate electrode 107 by a coating process, and the third photoresist layer 108 is patterned using a mask. The retained third photoresist layer 108 defines the patterns of the gate insulating layer 106 and the gate electrode 107 on the gate insulating layer 106 and the gate electrode 107.

Figure 4I:
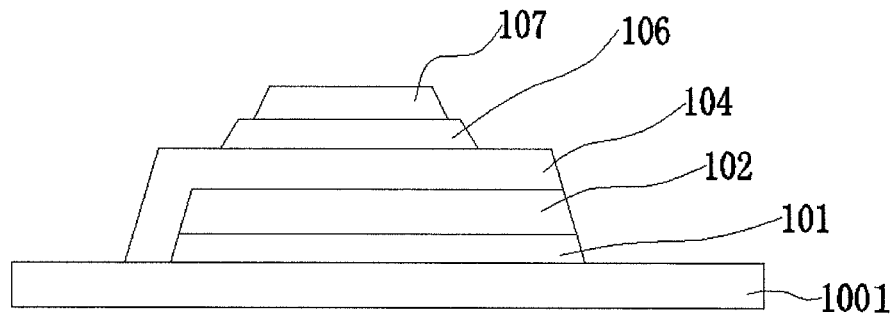
FIG. 4i is a flowchart of etching the gate insulator layer and the gate electrode of the TFT device according to an embodiment of present disclosure.

As shown in FIG. 4i, the gate insulation layer 106 and the gate electrode 107 are etched with the third photoresistor layer 108 as an etch stopper to obtain the corresponding gate insulation layer 106 and the gate electrode 107 and the third photoresistor layer 108 is stripped. In this embodiment, the gate insulating layer 106 is-formed on the active layer 104 using a method of chemical vapor deposition, and then annealed in dry air at 400° C. Generally, a material of the gate insulating layer 106 is one of silicon oxide (SiOx), silicon nitride (SiNx), silicon oxynitride (SiON), or a laminated structure of them. A material of the gate electrode 107 is metal material, such as copper (Cu), aluminum (Al), titanium (Ti), tantalum (Ta), tungsten (W), molybdenum (Mo), chromium (Cr), etc. The gate electrode 107 is formed on the gate insulating layer 106 by physical vapor deposition, and then a pattern of the gate electrode is formed by a photolithography process.

Figure 5A:
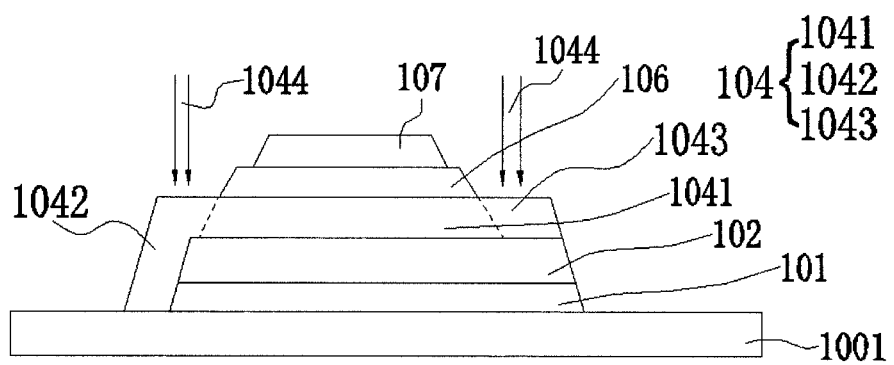
FIG. 5a is a flowchart of conductive treatment of the active layer of the TFT device according to an embodiment of present disclosure.
Figure 5B:
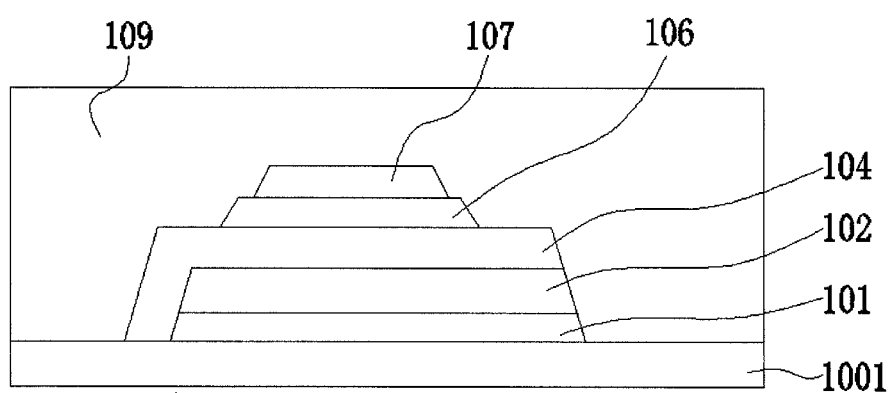
FIG. 5b is a flowchart of preparing an insulating interlayer of the TFT device according to an embodiment of present disclosure.

As shown in FIG. 5a, a conductive treatment of the active layer 104 is processed using plasma with the gate electrode 107 and the gate insulating layer 106 as etch stoppers to split the active layer 104 into the channel 1041 and the source doping member 1042 and the drain doping member 1043 which are disposed on two sides of the channel 1041. Corresponding part of the source doping member 1042 is attached to side surfaces of the buffer layer 102 and the light-shielding layer 101 and extends to a surface of the base surface 1001. The source doping member 1042 is electrically connected to the light-shielding layer 101.

A conductive treatment of the source doping member 1042 and drain doping member 1043 are processed with plasma 1044 to reduce an oxygen content in the source doping member 1042 and the drain doping member 1043. The resistivity of the metal oxide semiconductor material decreased and the metal oxide semiconductor material turns into conductor. Wherein, the plasma 1044 includes one or more than one of helium plasma, argon plasma and ammonia plasma.

As shown in FIG. 5b to FIG. 5i, the insulating interlayer 109 is prepared on the base substrate 1001, and the source electrode 205 and the drain electrode 206 are prepared on the insulating interlayer 109. Wherein, the insulating interlayer 109 covers the light-shielding layer 101, the buffer layer 102, the active layer 104, the gate insulation layer 106 and the gate electrode 107, and the source electrode 205 and the light-shielding layer 101 are electrically connected through the source doping member 1042.

Figure 5C:
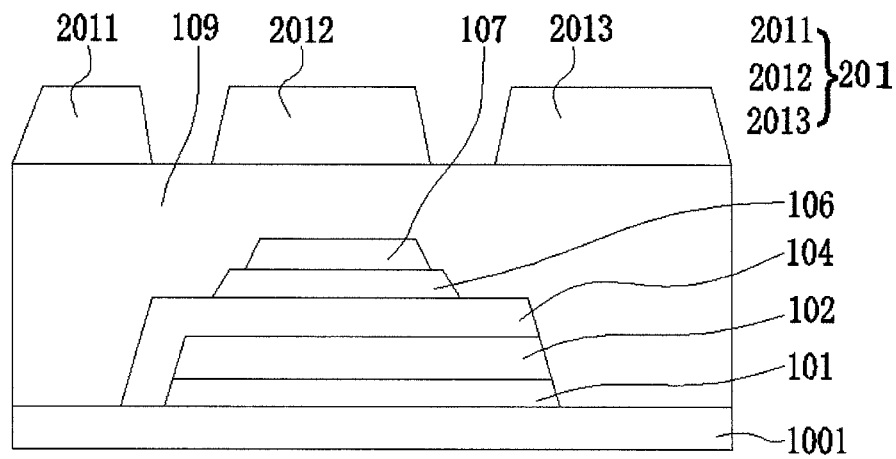
FIG. 5c is a flowchart of preparing a fourth photo-resist layer of the TFT device according to an embodiment of present disclosure.

As shown in FIG. 5c, a fourth photoresist layer 201 is coated on a surface of the insulating interlayer 109 by a coating process, and the fourth photoresist layer 201 is patterned using a mask to form a first sub-block 2011, a second sub-block 2012 and a third sub-block 2013 which are separated from each other.

Figure 5D:
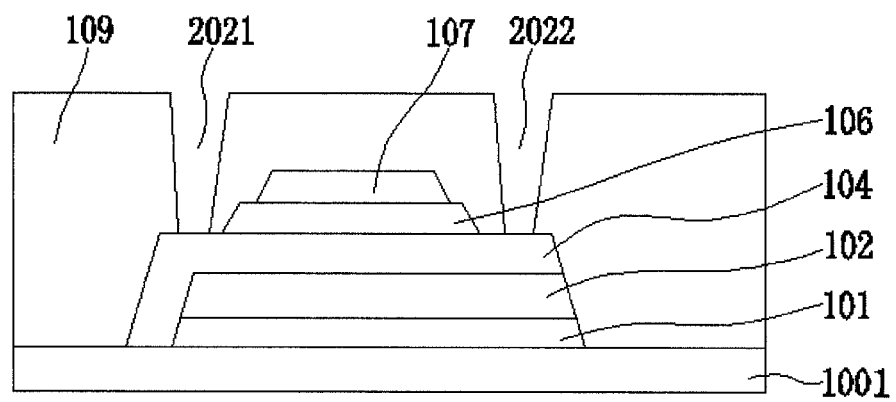
FIG. 5d is a flowchart of forming a source/drain contact hole of the TFT device according to an embodiment of present disclosure.

As shown in FIG. 5d, a plurality of holes are formed on the insulating interlayer 109 which is uncovered by the first block 2011, the second sub-block 2012, and the third sub-block 2013 using a dry-etch process, to form a source contact hole 2021 and a drain contact hole 2022, and the first sub-block 2011, the second sub-block 2012 and the third sub-block 2013 are stripped.

Figure 5E:
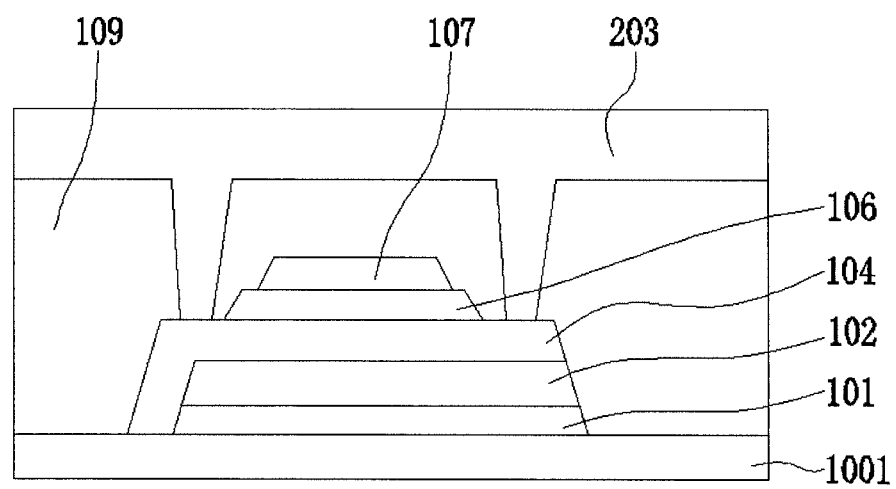
FIG. 5e is a flowchart of preparing a second metal layer of the TFT device according to an embodiment of present disclosure.
Figure 5F:
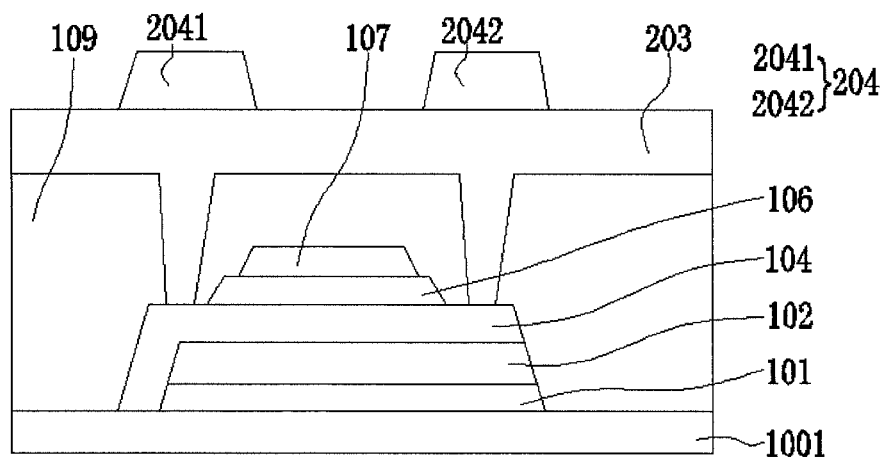
FIG. 5f is a flowchart of preparing a fifth photo-resist layer of the TFT device according to an embodiment of present disclosure.

As shown in FIG. 5e and FIG. 5f, a second metal layer 203 is deposited on the insulating interlayer 109, and a fifth photoresist layer 204 is coated on a surface of the second metal layer 203 by a coating process. The fifth photoresist layer 204 is patterned using a mask to form a fourth sub-block 2041 covering the source electrode area and a fifth sub-block 2042 covering the drain electrode area.

Figure 5G:
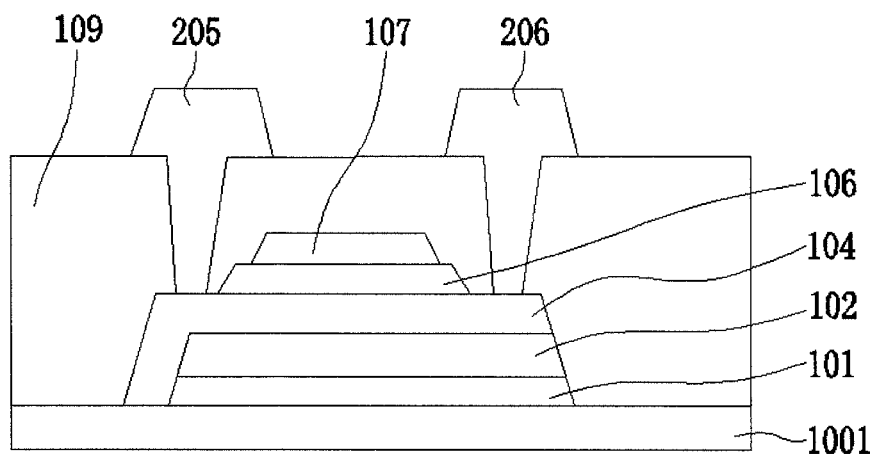
FIG. 5g is a flowchart of preparing a source/drain electrode of the TFT device according to an embodiment of present disclosure.

As shown in FIG. 5g, the second metal layer 203 is etched with the fourth sub-block 2041 and the fifth sub-block 2042 as etch stoppers. The Corresponding source electrode 205 and drain electrode 206 are obtained. The source electrode 205 is electrically connected with the source doping member 1042 through the source contact hole 2021 inside the insulating interlayer 109, and the drain electrode 206 is electrically connected with the drain doping member 1043 through the drain contact hole 2022 inside the insulating interlayer 109. At the same time, the source electrode 205 and the light-shielding layer 101 are electrically connected by the drain doping member 1042 and the fourth sub-block 2041 and the fifth sub-block 2042 are stripped.

Figure 5H:
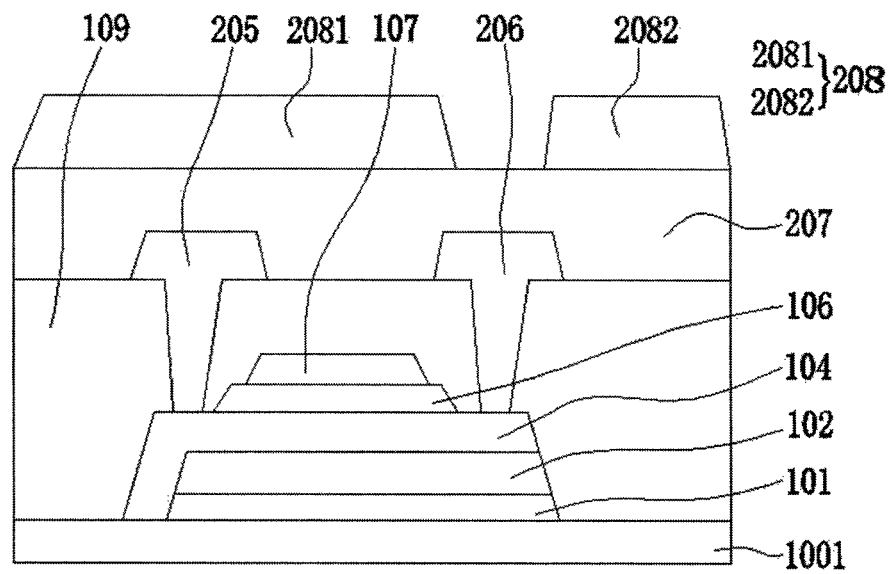
FIG. 5h is a flowchart of preparing a passivation layer, a via for pixel electrode of the TFT device according to an embodiment of present disclosure.

As shown in FIG. 5h, a passivation layer 207 is deposited on the insulating interlayer 109, the source electrode 205, and the drain electrode 206. A sixth photoresist layer 208 is coated on a surface of the passivation layer 207 by a coating process. The sixth photoresist layer 208 is patterned using a mask to form a sixth sub-block 2081 and a seventh sub-block and 2082 which are separated from each other.

Figure 5I:
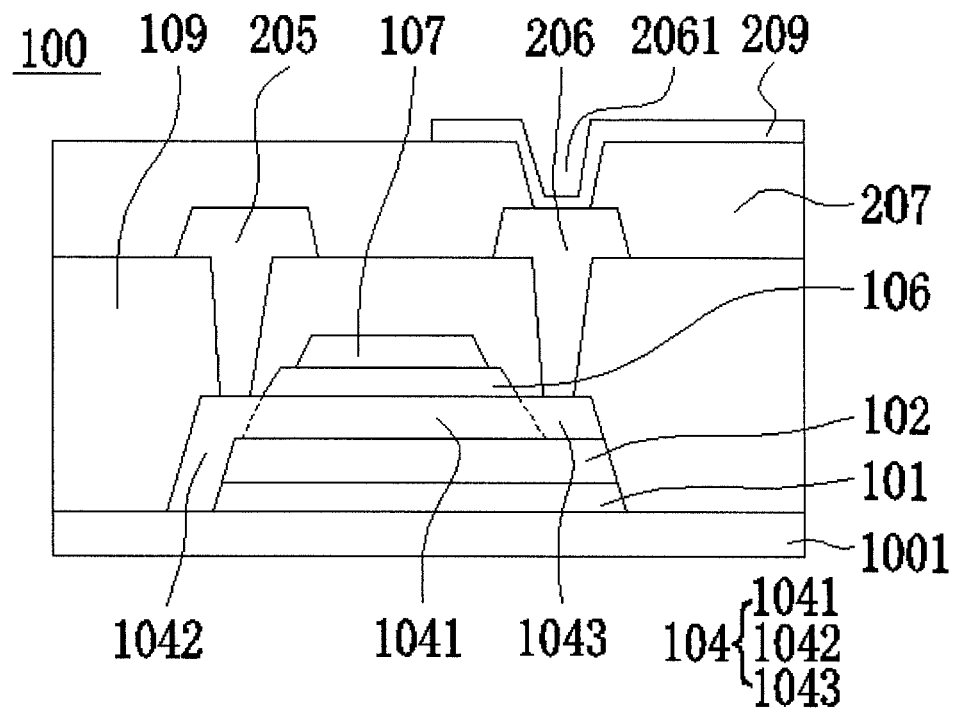
FIG. 5i is a flowchart of preparing a pixel electrode of the TFT device according to an embodiment of present disclosure.

As shown in FIG. 5i, the passivation layer 207 is etched with the sixth sub-block 2081 and the seventh-sub block 2082 as stopper layers, and a corresponding via 2061 is obtained. A pixel electrode layer 209 is formed on the passivation layer 207, and the pixel electrode layer 209 is connected with the drain electrode 206 through the via 2061 in the passivation layer 207.

The masks are half tone masks or gray tone masks. A gas used in the photolithography process of pattering any of the photoresist layers is oxygen, and time for patterning is in a range from 20 seconds to 100 seconds.

As shown in FIG. 2, the disclosure provides a structure of another active layer 104 of the TFT device 100. In the embodiment, the drain doping part 1043 is attached to the buffer layer 102 and the light-shielding layer 101, and the drain electrode 206 of the TFT device 100 and the light-shielding layer 101 are electrically connected through the drain doping part 1043. The source electrode 205 and the light shielding layer 101 of the TFT device 100 are insulated. The specific preparation method is similar to that in FIG. 4a to FIG. 5i.

According to the TFT device, a TFT array substrate is provided, comprising a TFT device according to the embodiment.

According to the purpose of this disclosure a display device is provided, comprising the above-mentioned TFT array substrate.

Beneficial effects of disclosure would be as below: in A TFT device and a manufacturing method of same, a TFT array substrate, and a display device are provided by this disclosure, by configuring the light-shielding layer under the active layer, the active layer can be protected from illumination, the negative shift of the threshold voltage of the TFT can be prevented. One end of the active layer is attached to the buffer layer and the light-shielding layer and extends to the surface of the base substrate. A conductive treatment is conducted on the active layer with a gate electrode and a gate insulator as stopper layer, one of the source doping member and the drain doping member is attached to the buffer layer and the light-shielding layer to generate a stable voltage on the light-shielding layer to prevent the floating gate effect from happening and increase the operational stability of the TFT. At the same time, forming holes in the light-shielding layer and the buffer layer is avoided and connecting the source electrode, the active layer and the light-shielding layer with conductive lines is no more needed, which decreases one mask, and corresponding exposure and etching process, thus decreases manufacturing cost of the TFT.

In conclusion, although this application discloses the embodiments as above, the above preferred embodiments are not intended to limit this application. Any modification, equivalent replacement, or improvement made by persons of ordinary skill in the art without departing from the spirit and scope of this application should fall within the scope of the present disclosure. Therefore, the protection scope of this application is subject to the appended claims.

What is claimed is:

1. A thin film transistor (TFT) device, comprising:
a base substrate;
a light-shielding layer disposed on the base substrate;
a buffer layer disposed on the light-shielding layer and covering the light-shielding layer; and
an active layer disposed on the buffer layer and corresponding to the light-shielding layer, wherein the active layer comprises a channel, and a source doping member and a drain doping member which are disposed on two sides of the channel;
wherein one of the source doping member and the drain doping member is disposed on and in contact with a side surface of the buffer layer and a side surface of the light-shielding layer, a cross-sectional shape of the active layer comprises a bending shape and comprises a horizontal part and an inclined part, and the horizontal part is connected to the light-shielding layer through the inclined part, and the horizontal part and the inclined part are integrally formed, and the inclined part is attached to the buffer layer and the light-shielding layer, and the inclined part extends to a surface of the base substrate.

2. The TFT device of claim 1, wherein a material of the active layer is metal oxide, and the source doping member and the drain doping member are defined as conductive layers after a conductive treatment.

3. The TFT device of claim 2, wherein a source electrode of the TFT device is electrically connected to the light-shielding layer by the source doping member, and a drain electrode of the TFT device is insulated from the light-shielding layer.

4. The TFT device of claim 2, wherein a drain electrode of the TFT device is electrically connected to the light-shielding layer by the drain doping member, and a source electrode of the TFT device is insulated from the light-shielding layer.

5. A TFT array substrate, comprising the TFT device of claim 1.

6. A display device, comprising the TFT array substrate of claim 5.

7. The display device of claim 6, wherein a material of the active layer is metal oxide, and the source doping member and the drain doping member are defined as conductive layers after a conductive treatment.

8. The display device of claim 7, wherein a source electrode of the TFT device is electrically connected to the light-shielding layer by the source doping member, and a drain electrode of the TFT device is insulated from the light-shielding layer.

9. The display device of claim 7, wherein a drain electrode of the TFT device is electrically connected to the light-shielding layer by the drain doping member, and a source electrode of the TFT device is insulated from the light-shielding layer.

10. The display device of claim 6, wherein an orthographic projection of the buffer layer on the light shielding layer is located in a range of the light shielding layer.

11. The TFT device of claim 1, wherein an orthographic projection of the buffer layer on the light shielding layer is located in a range of the light shielding layer.

* * * * *